United States Patent [19]

Vlasenko et al.

[11] 4,081,763

[45] Mar. 28, 1978

[54] ELECTROLUMINESCENT LASER

[76] Inventors: Natalya Andreevna Vlasenko, ulitsa Entuziastov 15, kv. 175; Zhanneta Alexandrovna Pukhly, bulvar Druzhby Narodov, 3b, Kv. 79, both of Kiev, U.S.S.R.

[21] Appl. No.: 760,581

[22] Filed: Jan. 19, 1977

Related U.S. Application Data

[63] Continuation of Ser. No. 320,926, Jan. 4, 1973, abandoned.

[51] Int. Cl.² .................................................. H01S 3/00
[52] U.S. Cl. ............................ 331/94.5 H; 331/94.5 C; 350/166
[58] Field of Search ................. 331/94.5 H, 94.5 C; 313/502, 503; 350/164, 166

[56] References Cited

U.S. PATENT DOCUMENTS

| | | | |
|---|---|---|---|
| 3,046,432 | 7/1962 | Nehrich | 313/503 |
| 3,248,669 | 4/1966 | Dunke et al., | 331/94.5 H |
| 3,268,755 | 8/1966 | Reschauer | 313/503 |
| 3,431,437 | 3/1969 | Kosonocky | 331/94.5 H X |
| 3,579,130 | 5/1973 | Smiley | 331/94.5 H X |
| 3,621,455 | 11/1971 | Green | 331/94.5 H |

OTHER PUBLICATIONS

Vlasenko et a., Pisma & ZhETF, vol. 14, No. 2, 1971.
Jvey, "Electroluminescence and Semiconductor Lasers", IEEE Jour. of Quantam Electronics, vol. QE-Z, pp. 713-26, Nov. 1966.

*Primary Examiner*—Edward S. Bauer
*Attorney, Agent, or Firm*—Holman & Stern

[57] ABSTRACT

A solid-state laser in which an inverse population is formed at the levels of dope ions of the elements with unfilled electron shells by means of impact excitation of said ions with hot carriers, made on the basis of an electroluminescent capacitor in which the layer of electroluminescent substance is optically homogeneous, doped with said elements, and serves as the active element of the laser. The electrodes of the capacitor perform the functions of the Fabry-Perot cavity mirrors and those of the electrodes in order to produce the electrical field required to excite the active element. One of these electrodes is partially transparent to the laser emission.

3 Claims, 4 Drawing Figures

ELECTROLUMINESCENT LASER

This is a continuation of application Ser. No. 320,926, filed Jan. 4, 1973 and now abandoned.

BACKGROUND OF THE INVENTION

The invention relates to lasers and in particular to solid-state lasers for use in quantum electronics, computer devices, optoelectronics, holography and display devices.

A solid-state injection laser employing a p-n junction monocrystal as an active element is known in the art. The facets of the crystal which are normal to the junction are polished to serve as mirrors of a Fabry-Perot cavity. The monocrystal is located between two excitation electrodes which is energized by a required voltage in order to excite the active element.

This laser suffers from a number of drawbacks, vis. the small size of the emission surface (about 1 sq.mm); also high current densities in the generation mode (the threshold current is about 100 A/cm$^2$ at 4.2° K and 10$^5$ A/cm$^2$ at the room temperature); no generation at room temperature under the conditions of continuous excitation.

SUMMARY OF THE INVENTION

The object of the present invention is to provide a solid-state laser having a large emission surface and low current densities in the generation mode which is able to operate at the room temperature under the conditions of continuous excitation and which assures a high efficiency of converting electric energy into light energy.

This object is achieved by providing a solid-state laser which comprises a Fabry-Perot cavity having an active element excited by an electric field that is produced by a voltage being applied to the excitation electrodes having the active element located between them and which, according to the invention, is arranged around a so called electroluminescent capacitor with the layer of the electroluminescent material of said capacitor being optically homogeneous and being doped with elements having unfilled electron shells and which serves as the active element of the laser while the electrodes of the capacitor perform the functions of Fabry-Perot cavity mirrors and those of the active element excitation, with one of them being partially transparent to the laser emission.

It is preferable that the active element be made in the form of a film.

The preferred material for said film is ZnS:Mn.

The active element may be made as a crystal having plane-parallel facets.

It is also feasible that the active element could use a powder in an immersion medium which serves as a dielectric material transparent to the laser emission whose refractive index is equal to that of said powder.

In the preferred embodiment of the invention, it is at least expedient to design the partially transparent electrode mirrors as a structure consisting of a number of interlaced layers having high and low refractive indices, which would have a high refraction coefficient for the laser emission wavelength, and a layer of a conductive material which would be transparent to the laser emission.

It is feasible that the multi-layer structure should be made of interlaced ZnS, and MgF$_2$; and the layer of the conductive material be made of a SnO$_2$ film.

The proposed solid-state laser possesses a number of advantages, the major of them being: a simple design, a small size, low-cost for the materials, the efficiency of the conversion of electric energy to light energy said conversion being almost equal to unity with a low current threshold, which are attributed to the method of obtaining the inverse population through the impact excitation of the impurity centres under the conditions of the electrical fields direct excitation. Besides, the laser has a wide emission surface which can have an area of scores of square centimeters. It also makes it possible to obtain generation at the room temperature.

BRIEF DESCRIPTION OF THE DRAWINGS

The invention will be better understood from the description of its embodiments given by way of example with reference to the accompanying drawings, in which.

DETAILED DESCRIPTION OF A PREFERRED EMBODIMENT

Figure 1:
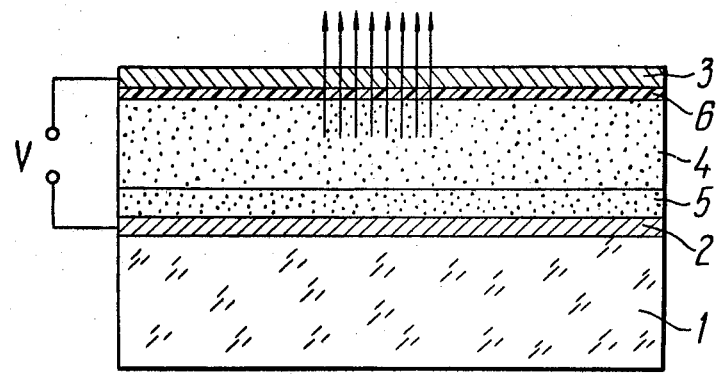
FIG. 1 is a cross section of a solid-state laser according to the invention.

The solid-state laser shown schematically in FIG. 1 comprises a substrate 1 and an electroluminescent capacitor placed onto the substrate which is formed by a lower electrode 2 applied to the substrate 1 and an upper electrode 3 both made of a highly reflective material and serving also as the Fabry-Perot cavity mirrors. Between the electrodes a layer of electroluminescent substance is located which comprises an active element 4 of the laser, a protection layer 5 and an insulator layer 6.

The substrate 1 should have a mirror-like surface and should be able to withstand the temperatures encountered in the process of depositing the electroluminescent material. If the laser emission is brought out through the substrate 1, the latter shall be made of transparent materials, e.g. glass, quartz crystal, etc.

In case the emission is brought out through the upper mirror-electrode 3, the functions of the substrate 1 can be performed by a plate of a highly reflective metal having a mirror-like surface which simultaneously serves as the lower mirror of the cavity.

The active element 4 of the laser should be made of an optically homogeneous electroluminescent substance. Suitable for this purpose are substances doped with elements having unfilled electron shells, e.g., the transition or rare-earth elements in which it is possible to produce inverse populations in the impurity levels through out the electric field excitation.

It is preferable that wide-zone high-resistance semiconductors, such as ZnS:Mn, should be used for this purpose.

The active element 4 can be made by applying a film or a powder onto the mirror substrate, with the powder being immersed into a medium of a dielectric material which is transparent to the laser emission whose refractive index is equal to that of the powder.

The active element 4 can also be designed as a crystal having plane-parallel polished facets. In this case the substrate 1 is excluded from the design.

The electrode mirrors 2 and 3 are made as layers of a conductive and a highly reflective material.

In the laser embodiment under discussion, the emission is brought out through the electrode mirrors 5 which is partially transparent to this emission. The electrode mirror 2 and 3 are designed either as continuous members or as intermittent pieces consisting of areas which are electrically isolated from one another and have preset sizes and shapes, e.g. rectangles, circles, segments, certain symbols or systems of parallel stripes. Such arrangements allows for multiple sources of stimulated emission of a required geometry on a single substrate to be obtained as well as flat matrix or mosaic screens. The electrodes 2 and 3 are made of metal films, such as Al, or Au.

The electrode mirros 2 may also be made as a polished plate of a highly reflective conductive material which can simultaneously perform the functions of the substrate 1.

The protection layer 5 serves to prevent the mutual diffusion between the material of the electrode mirrors 3 and the electroluminescent substance referred to thereafter as a phosphor in the course of deposition of the latter. Materials that could be used to make the protection layer should meet a number of requirements imposed by the temperatures involved in the process of manufacturing the laser. These are: a low diffusion coefficient for the material of the electrode mirrors 3, chemical resistance to the substances used for the layers adjacent to the protection layer 5, a low rate of diffusion of its components into the layer of the phosphor. Suitable substances for the protection layer are, for example, SiO, $Tn_2O_5$, $CaF_2$. In case the active element 4 is made of ZnS:Mn, but it is feasible that the protection layer should be made of a recrystallized film of an undoped basic phosphor substance, e.g. a ZnS film. The protection layer 5 should be made as thin as possible in order to reduce the voltage drop that occurs across it.

The insulator layer 6 performs the same function as in ordinary electroluminescent films, i.e., it prevents the short circuiting of the phosphor layer in the process of deposition of the upper mirrors 3, thus raising the break down level of the electric field strength in the laser. This layer is made as an insulator film (for instance, SiO) whose thickness is much smaller than that of the active element 4.

Figure 2:
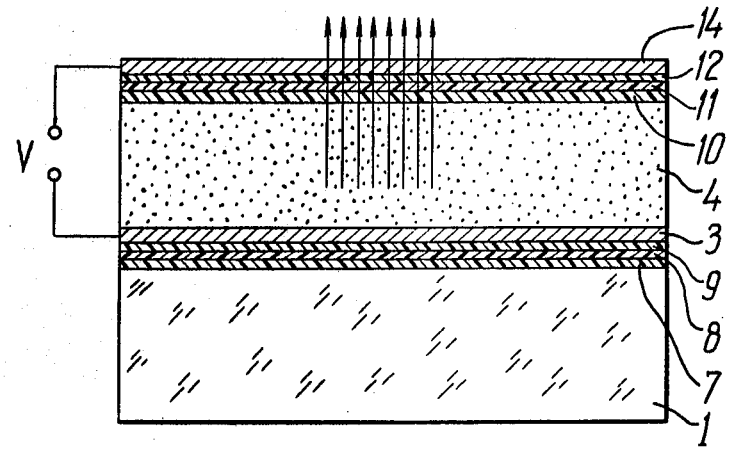
FIG. 2 is a cross section of another embodiment of the solid-state laser according to the invention.

FIG. 2 shows another embodiment of a solid-state laser made as an electroluminescent capacitor which is applied onto a substrate 1. In contrast with the embodiment described above and in order to increase the Q-factor of the cavity, the electrode mirrors 2 and 3 are arranged as multi-layer structures consisting of interlaced layers 7,8,9 and 10,11,12 having high and low refractive indices and of layers 13 and 14 (one for each structure) made of a conductive material which is transparent to the laser emission. An active element 4 is placed between the structures. The multi-layer structures should have a high reflection coefficient at the laser emission wavelength. The layers 7,8,9 and 10,11,12 can be made of ZnS and $MgF_2$ or of ZnS and $Na_3AlF_6$. They should be arranged interdigitally. The layers 13 and 14 can be made as transparent films of a conductive substance selected from the $SnO_2$, $In_2O_3$, CdO, ZnO group. The number of layers in the above mentioned structures can exceed the number of three as is shown in FIG. 2. The lower and upper electrode mirrors 2 and 3 respectively can have various numbers of interlaced layers havng high and low refractive indices, the actual number depends upon which is partially transparent and used to transmit the laser emission.

There can be different ways of arranging the conductive layers 13 and 14 with respect to the interlaced layers 7,8,9 and 10,11,12. The layers 13 and 14 can be arranged so that the layers 7,8,9 and 10,11,12 as well as the active element 4 are located between them or so that placed between them are either the layers 7,8,9 (or 10,11,12) and the active element 4, or only the active element 4. The two latter ways of arranging the layers 13 and 14 are preferable from the points of view of being able to lower the value of the laser operating voltage.

The laser can be of a simpler design with a sufficiently high Q-factor for the cavity, where the non-transparent electrode is made as an opaque metal layer having a high reflection coefficient (for instance, an Al film), while the partially transparent electrode mirrors is made as a multi-layer structure.

The proposed solid-state laser operates as follows. A voltage from a power suply not shown in the drawing is applied to the electrode mirrors 2 and 3 (FIG. 1) or to the layers 13 and 14 (FIG. 2) which creates an intensive electric field (about $10^6$ V/cm) in the active element 4, which is sufficient to produce impact excitation of the electroluminescence. When the excitation reaches its threshold level, the inverse population is created at the levels of the impurity centres (transistion or rare-earth elements) and the laser starts generating. The function of the Fabry-Perot cavity in the proposed laser embodiment is similar to that in the known devices. The wavelength of the laser emission depends on the type of phosphor and its doped impurity, as well as on the thickness of the active element 4 and on the angle at which the emission leaves the laser cavity.

A fuller understanding of the essence of the present invention may be had from the following description of an example of its embodiment, its operation and manufacturing procedure.

The proposed laser is arranged around thin (about 1 micron) ZnS:Mn electroluminescent films. A partially transparent gold layer is applied onto the glass plane-parallel substrate 1 having a reflection coefficient of R = 65 to 75% which simultaneously serves as the electrode 2 and a Fabry-Perot cavity mirror. It carries the protection layer 5 made as an undoped ZnS film 150 to 200 nanometers thick. Placed above the layer 5 is an electroluminescent ZnS film doped with Mn having a concentration of $Mn-C_{Mn}=$ 1-2 weight percent and being within 0.6 to 1.0 micron thick (the active element). A SiO-insulator layer 6 being 20–25 nanometers thick is then placed and an opaque Al film which serves as the second electrode 3 of the electroluminescent capacitor and at the same time as the upper Fabry-Perot cavity mirror. It has a reflection coefficient of R=90%.

Figure 4:
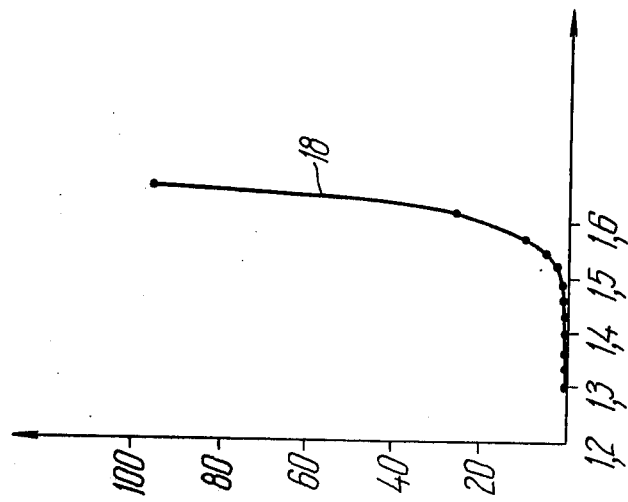
FIG. 4 shows the relationship between the specific power of the laser emission and the excitation level.
Figure 3:
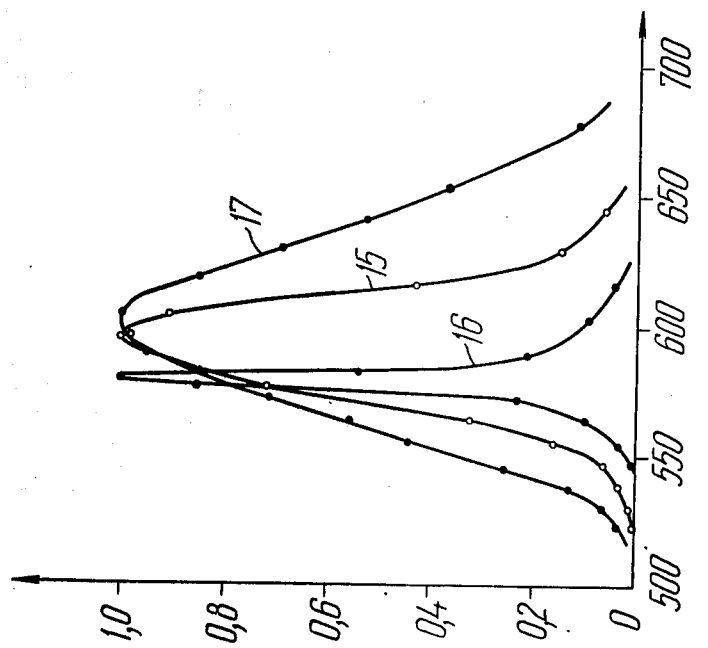
FIG. 3 presents spectral characteristics illustrating the performance of a particular embodiment of the proposed solid-state laser.

In operation, the electrodes 2 and 3 are fed with an audio frequency effective voltage of 65 to 75 V. The laser emission is brought out through the lower electrode 2 and the substrate 1. At a voltage below 60 V the system being discussed would produce a spontaneous emission the spectrum of which is shown in FIG. 3 (curve 15) where the X-axis gives the wavelength in nanometers and Y-axis indicates the intensity of emissions related to the intensity at the maximum of a emission band. After the threshold of 60 V has been reached, the emission band would get considerably compressed and in the generation mode it half-width would be 6 to 8 nanometers (curve 16), which is one order of magnitude below the natural emission band ZnS:Mn (curve 17). The divergence angle of the laser emission in this case does not exceed 10°. The compression of the emission band is accompanied by a sharp increase of its power as illustrated by curve 18 (FIG. 4) where the X-axis shows the intensity of the electrical field in volts per centimeter and the Y-axis presents the specific power emission in milliwatts per square centimeter of the laser emission surface.

The laser being described has been manufactured in the following way.

A glass plane-parallel substrate 1 cleaned beforehand is used as a basis onto which a partially transparent gold layer is deposited by evaporation in a vacuum of $(1+2)\times 10^{-5}$ torr. The reflection coefficient of the gold layer is 65 to 75%. It serves as an electrode 2 and at the same time as a Fabry-Perot cavity mirror. On undoped film of ZnS 150–200 nanometers thick is deposited onto it by evaporation in a vacuum of $(1+2)\times 10^{-5}$ torr which serves as a protection layer 5. This film is crystallized by means of annealing same in a vacuum of $10^{-5}$ torr at 550 to 600° C for 5 to 10 minutes. Placed above this layer is an electroluminescent film (the active element 4) of the ZnS:Mn active substance which is about 600 nanometers thick. The process consists of two steps. At first a ZnS film is applied by means of evaporation in a vacuum of $10^{-5}$ torr. Simultaneously an Mn-activator is vaporized into this film. Then, the total layer is annealed in a vacuum of about $10^{-5}$ torr at 650 to 670° C for 5 to 10 minutes.

During the procedure, the film is crystallized and simultaneously the Mn activator becomes uniformly implanted into the ZnS lattice throughout the thickness of the film. The concentration of the implanted manganese is from 1 to 2 weight percent. The vacuum evaporation process is then used to apply a SiO insulator layer 6 being 20 to 35 nanometers thick and an opaque Al film having a reflection coefficient of R=90%, which serves as the second electrode 3 of the electroluminescent capacitor and as the upper mirror of the Fabry-Perot cavity.

What is claimed is:

1. A solid-state laser with a Fabry-Perot cavity in which an inverted population is formed at the levels of dope ions which are elements having unfilled electron shells by means of impact excitation of said ions with carriers accelerated by an electric field, made on the basis of an electroluminescent capacitor and comprising:
    an active element, which is a layer of an electroluminescent substance of said capacitor; which is optically homogeneous and doped with said elements having unfilled electron shells;
    electrodes for said capacitor, between which said active element is disposed, said electrodes being intended to form an electric excitation field of said active element;
    said electrodes being simultaneously the mirrors of a Fabry-Perot cavity, one of said electrode mirrors being partially transparent to the laser emission, a voltage being applied to said electrodes, wherein the active element is a powder placed in an immersion medium which is a dielectric transparent to the laser emission whose refractive index is equal to that of the powder.

2. A solid-state laser with a Fabry-Perot cavity in which an inverted population is formed at the levels of dope ions which are elements having unfilled electron shells by means of impact excitation of said ions with carriers accelerated by an electric field, made on the basis of an electroluminescent capacitor and comprising:
    an active element, which is a layer of an electroluminescent substance of said capacitor;
    which is optically homogeneous and doped with said elements having unfilled electron shells;
    multi-layer structure electrodes for said capacitor, between which said active element is disposed, said electrodes being intended to form an electric excitation field of said active element, said electrodes being simultaneously the mirrors of a Fabry-Perot cavity, one of said electrode mirrors being partially transparent to the laser emission, a voltage being applied to said electrodes;
    said multi-layer structure being made of interlaced ZnS and MgF$_2$ layers and a SnO$_2$ layer.

3. The apparatus of claim 2 wherein said active element is a ZnS film which is uniformly doped over its thickness with manganese;
    said electrodes are made of SnO$_2$ transparent to laser radiation;
    and said mirrors of said cavity are comprised of a multi-layer structure of alternating layers of ZnS and MgF$_2$, said mirrors having a high reflection coefficient for the wave length of laser radiation, said mirrors being arranged from each other at a distance which is a multiple of the wave length of radiation from said laser.

* * * * *